United States Patent
Chang et al.

(10) Patent No.: US 11,137,370 B2
(45) Date of Patent: Oct. 5, 2021

(54) SENSOR WITH NANOWIRE HEATER

(71) Applicant: Taiwan Semiconductor Manufacturing Company, Ltd., Hsinchu (TW)

(72) Inventors: Allen Timothy Chang, Hsinchu (TW); Tung-Tsun Chen, Hsinchu (TW); Jui-Cheng Huang, Hsinchu (TW); Yu-Jie Huang, Hsinchu (TW); Yi-Hsing Hsiao, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 16/524,355

(22) Filed: Jul. 29, 2019

(65) Prior Publication Data

US 2020/0041447 A1 Feb. 6, 2020

Related U.S. Application Data

(60) Provisional application No. 62/712,724, filed on Jul. 31, 2018.

(51) Int. Cl.
*H01L 29/66* (2006.01)
*H01L 29/78* (2006.01)
*G01N 27/414* (2006.01)

(52) U.S. Cl.
CPC ..... *G01N 27/4146* (2013.01); *G01N 27/4141* (2013.01); *G01N 27/4145* (2013.01); *G01N 27/4148* (2013.01); *H01L 29/66* (2013.01); *H01L 29/78* (2013.01)

(58) Field of Classification Search
CPC ............. H01L 21/76895; H01L 23/345; H01L 23/5228; H01L 27/1203; H01L 29/78696
See application file for complete search history.

(56) References Cited

U.S. PATENT DOCUMENTS

| | | | |
|---|---|---|---|
| 2010/0258882 A1* | 10/2010 | Magnee | B81C 1/00246 257/415 |
| 2012/0319535 A1* | 12/2012 | Dausch | H01L 41/0475 310/365 |
| 2016/0334362 A1* | 11/2016 | Liu | H01L 23/345 |
| 2017/0122892 A1* | 5/2017 | Li | G01N 27/127 |
| 2017/0343498 A1 | 11/2017 | Kalnitsky et al. | |

* cited by examiner

*Primary Examiner* — Herve-Louis Y Assouman
(74) *Attorney, Agent, or Firm* — Merchant & Gould P.C.

(57) ABSTRACT

A sensor with a nanowire heater may be provided. The sensor may be patterned in a device layer of a Silicon on Insulation (SOI) wafer comprising a backside layer and a Buried Oxide (BOX) layer and the nanowire heater may be patterned in the device layer of the SOI wafer adjacent to the sensor. Next, metal routing may be created for the SOI wafer and a bond carrier wafer may be provided on a metal routing side of the SOI wafer. The backside layer may then be ground until the BOX layer is exposed. Then the device layer may be patterned through the BOX layer to expose the sensor and the nanowire heater. A dielectric may be deposited covering at least one of the following: the sensor; and the nanowire heater.

12 Claims, 17 Drawing Sheets

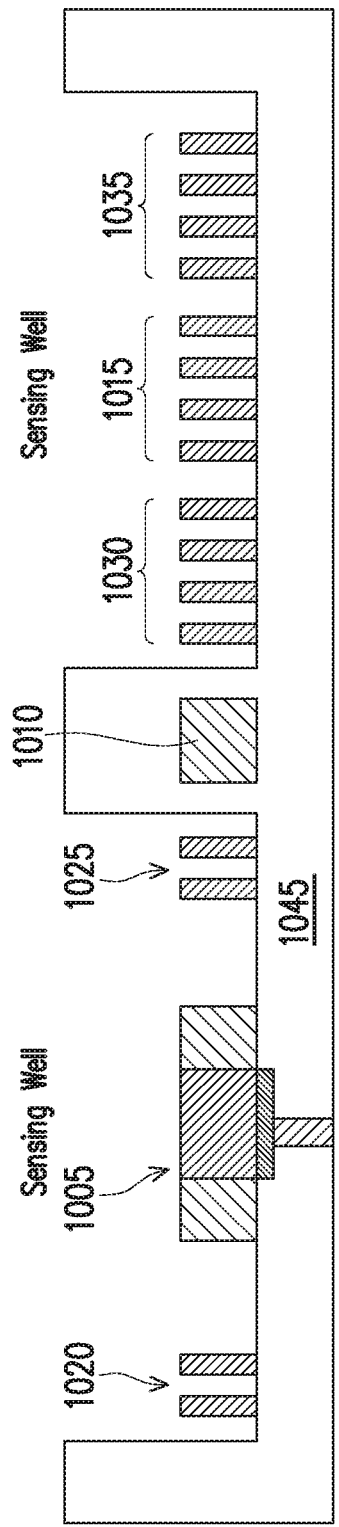
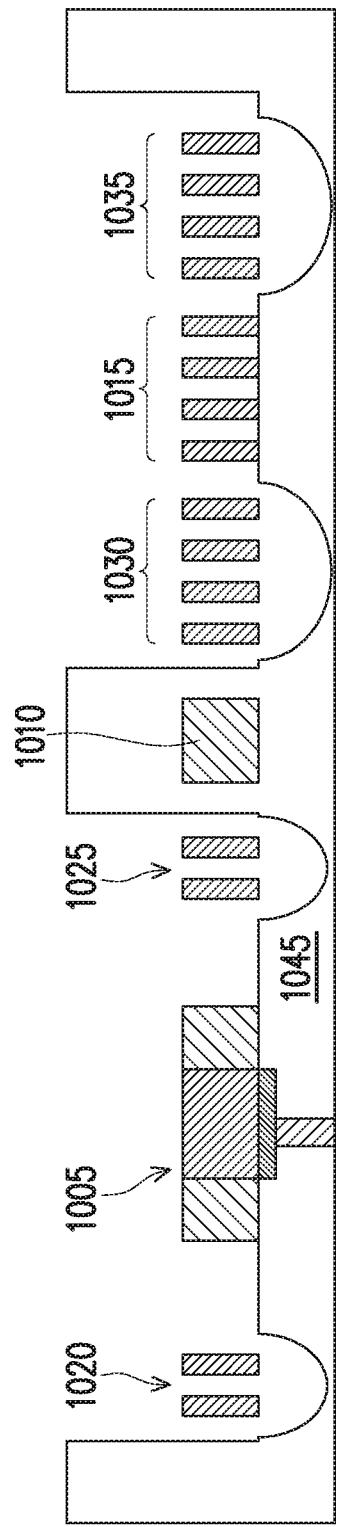
FIG. 10A
FIG. 10B

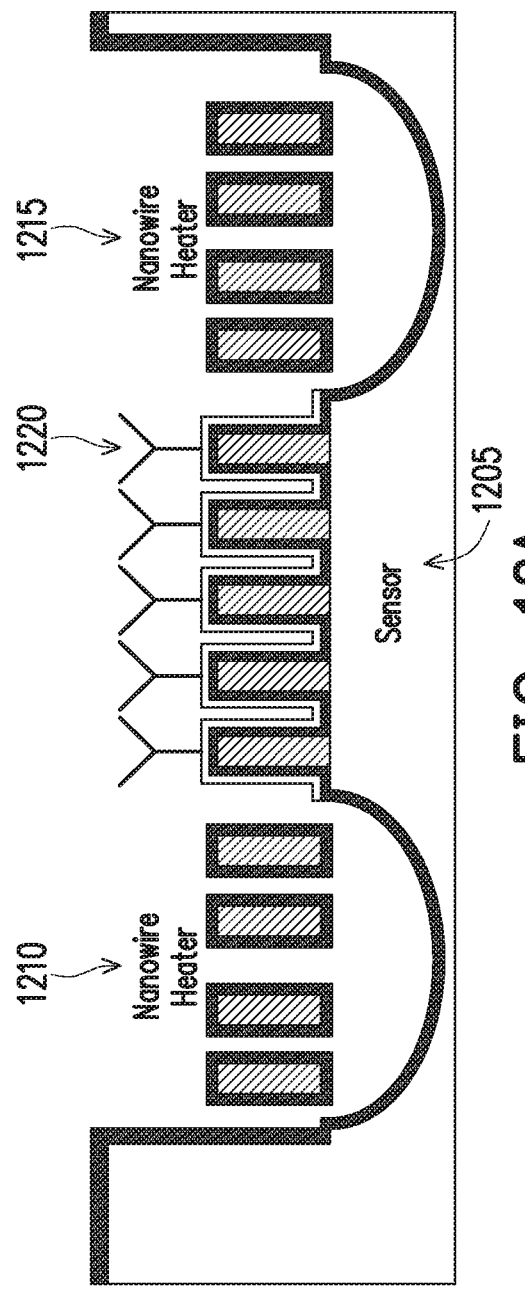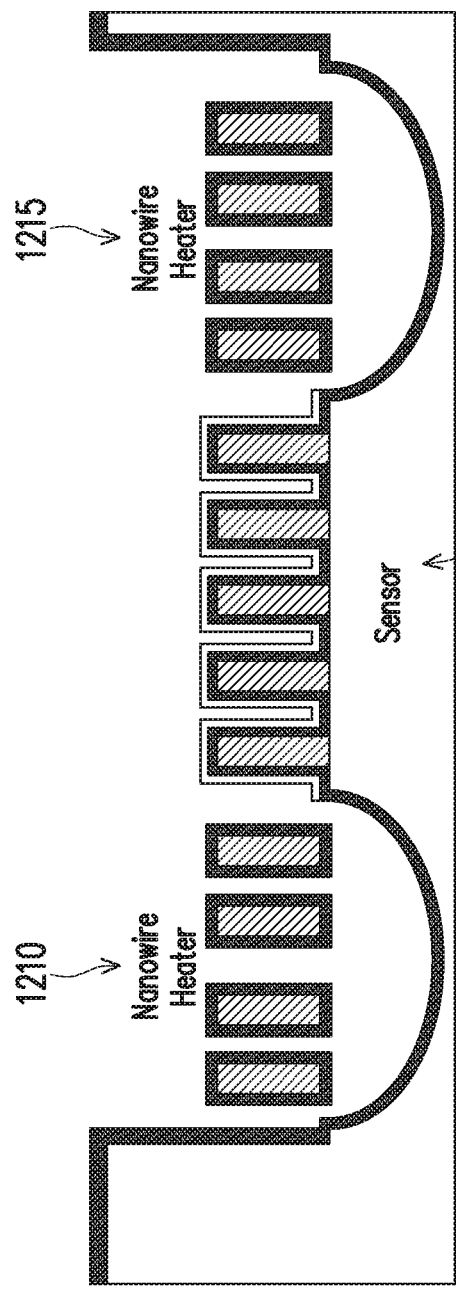
FIG. 12A
FIG. 12B

SENSOR WITH NANOWIRE HEATER

CROSS-REFERENCE TO RELATED APPLICATIONS

This application claims priority to U.S. Provisional Application No. 62/712,724, filed on Jul. 31, 2018, and entitled "SENSOR WITH NANOWIRE HEATER", of which the entire disclosure is hereby incorporated by reference in its entirety.

BACKGROUND

The semiconductor device industry has produced a wide variety of devices at decreasing cost to address issues in a number of different areas. This has been achieved at least in part due to increasing integration density. The integration density of various integrated circuit components such as transistors, diodes, resistors and capacitors have benefited from continual reductions in minimum feature size into the deep submicron regime that in turn allows more components to be integrated into a given area. Computer added design/electronic design automation (CAD/EDA) tools facilitate highly integrated circuit designs including numerous Oxide Diffusion (OD) areas on each die. The OD areas correspond to active device areas and CAD/EDA tools define their arrangement. OD generally refers to active doped/diffusion regions.

Semiconductor devices may include sensors such as gas sensors and biosensors. Biosensors are devices for sensing and detecting bio-entities, and typically operate on the basis of electronic, chemical, optical, or mechanical detection principles. Detection can be performed by detecting the bio-entities themselves, or through interaction and reaction between specified reactants and the bio-entities. Biosensors are widely used in different life-science applications, ranging from environmental monitoring and basic life science research to Point-of-Care ("PoC") in-vitro molecular diagnostics.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 10A, 10B, and 10C illustrate using oxide overetch with sufficient undercut to let heater nanowires to be released in accordance with some embodiments.

FIGS. 12A and 12B illustrate a surface chemistry treatment for elevated temperature in accordance with some embodiments.

DETAILED DESCRIPTION

Figure 1:
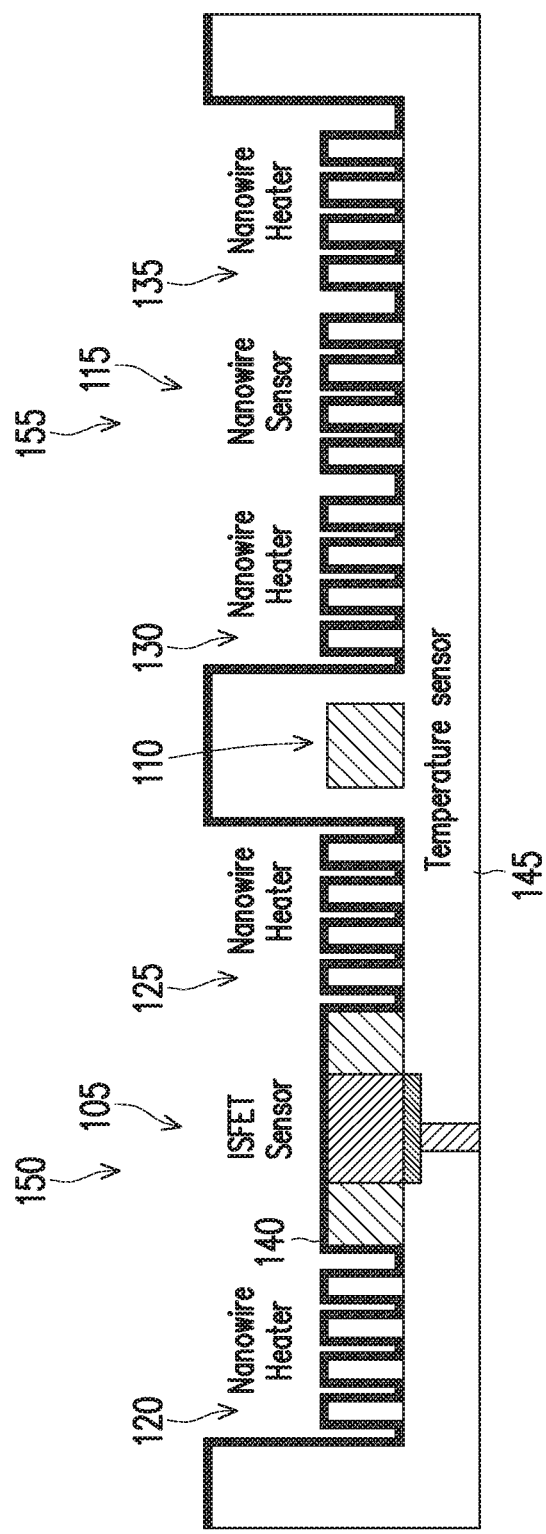
FIG. 1 is a block diagram that illustrates sensors with nanowire heaters in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In sensing platforms, Oxide Diffusion (OD) resistor heaters and Titanium Aluminum Nitride (TiAlN) metal heaters may be located respectively at the frontend and backend of a back side sensing Complementary Metal Oxide Semiconductor (CMOS) platform. TiAlN may only provide indirect heating by virtue of being buried in the backend. OD resistor heaters may provide less surface area for heating compared to nanowire heaters. Consistent with embodiments of the disclosure, nanowires as heaters in sensing applications may be fabricated, for example, in a CMOS compatible process or integrated with a CMOS platform.

For instance, certain biosensor devices have a heater embedded therein. A semiconductor layer may comprise semiconducting material that may include a source region and a drain region for example. A sensing well may be over the semiconductor layer, laterally between the source region and the drain region. A bio-sensing layer lines the sensing well. In some embodiments, a metal routing interconnect structure is arranged under the semiconductor layer and accommodates the heater. Further, in some embodiments, a temperature sensor is laterally adjacent to the gate electrode and a controller controls the heater based on feedback from the temperature sensor.

Consistent with embodiments of the disclosure, Silicon (Si) nanowire heaters may be integrated next to (i.e., laterally adjacent to) sensors fabricated using a back side sensing CMOS platform. This may be useful, for example, in small sample applications such as single-molecular Polymerase Chain Reaction (PCR) "biosensors" or for high-temperature gas sensors. Si nanowire heater applications may also include, but are not limited to, PoC, DNA-Sequencing, disease diagnostics systems, and gas sensors.

Furthermore, while Si nanowire heaters may be narrower than OD heaters, nanowires implemented as crystalline silicon may not suffer from electro-migration. Moreover, Si nanowire heaters may provide direct heating as compared to TiAlN heaters, which may be buried in the backend oxide. In addition, Si nanowire heaters have more surface area to dissipate heat. Accordingly, embodiments of the disclosure may not suffer from electro-migration, may provide direct heating, and may include more surface area for heat dissipation.

Consistent with embodiments of the disclosure, when nanowire sensors (e.g., as gas sensors) are used, the nanowire sensors may be tightly integrated with the nanowire heaters. Additionally, it may be advantageous not to have nanowires serve in a dual role of heater and sensor because bias currents needed for each role may be different. Consequently, it may be better to have nanowires of different roles being placed close together.

Example processes include patterning nanowire heaters and bio-sensing or gas sensing devices at the Front End of Line (FEOL) of a Silicon on Insulation (SOI) wafer. Nanowires and bio-sensing/gas sensing devices may be doped separately. For example, a sensor implemented as a an Ion-Sensitive Field-Effect Transistor (ISFET) may have different doping requirements compared a nanowire heater. A nanowire sensor may be doped differently from a nanowire heater. Metal routing may be created, and a carrier wafer may be bonded on the metal routing side. The stacked structure may then be flipped. The "back side" may be ground until a Buried Oxide (BOX) is exposed. The oxide is patterned to expose nanowires and biosensors, creating sensing wells. If dry etching is used, antenna diodes may be required to prevent damage of supporting transistor circuitry. An Atomic Layer Deposition (ALD) high-k dielectric may be deposited, covering the nanowires and biosensors. The nanowires may be connected and doped in various ways as described below.

In another example, an oxide overetch may be used with sufficient undercut to let heater nanowires be released. ISFET-based sensors may be covered with PR to prevent release. Nanowire sensors may be released or not released (e.g., using PR). An ALD high-k dielectric may be deposited (e.g., for bio-sensing applications involving a liquid environment).

In further examples, the OD diffusion may be kept until the end, and then the OD may be etched into nanowires. However, this may limit the BOX height to be $3k$ or below because a thin photoresist may be required to achieve good nanowire resolution.

Some biosensor applications may require elevated temperature to perform analysis. Furthermore, in the case of nanowire sensors, a high-k material may not be required over a sensing well for a gas sensor because the gas sensor may not be in a wet fluidic environment. The nanowire sensor may be bare-Si or have an appropriate surface coating. It may be coated with another semiconducting material such as $SnO_2$. Gas sensors may have different temperature requirements depending on the surface coating. $SnO_2$ may have a 150 C-400 C operating temperature requirement.

In the case of a Field Effect Transistor (FET)-based gas sensor that uses a special gate electrode as a sensing material, a high-k dielectric may be patterned on the sensor. Additionally, the special gate electrode may be routed to a pad outside of the sensing well.

FIG. 1 illustrates a sensor with a nanowire heater consistent with embodiments of the disclosure. As shown in FIG. 1, a plurality of different sensors may be used comprising, for example, a first sensor 105, a second sensor 110, and a third sensor 115. First sensor 105 may comprise an Ion-Sensitive Field-Effect Transistor (ISFET) that may be used for gas sensing or bio-sensing for example. Second sensor 110 may comprise a temperature sensor. Third sensor 115 may comprise a nanowire sensor that may comprise a plurality of segments as described in greater detail below. FIG. 1 may also illustrate a plurality of nanowire heaters comprising, for example, a first nanowire heater 120, a second nanowire heater 125, a third nanowire heater 130, and a fourth nanowire heater 135. Each of the plurality of nanowire heaters may comprise a plurality of segments as described in greater detail below.

As shown in FIG. 1, first nanowire heater 120 and second nanowire heater 125 may be adjacent to first sensor 105, second nanowire heater 125 and third nanowire heater 130 may be adjacent to second sensor 110, and third nanowire heater 130 and fourth nanowire heater 135 may be adjacent to third sensor 115. A first dielectric layer 140 may be formed over first sensor 105, second sensor 110, third sensor 115, first nanowire heater 120, second nanowire heater 125, third nanowire heater 130, and fourth nanowire heater 135 as will be described in greater detail below. As shown in FIG. 1, second sensor 110 may comprise a temperature sensor and may be covered by a second dielectric layer 145 that may be covered by first dielectric layer 140. Consistent with embodiments of the disclosure, the nanowire sensors may serve as either a biosensor or a gas sensor for example. Sensors may be placed with heaters on both side to provide a uniform temperature environment for the sensor. For example, the heaters may operate on the principle of Joule/Ohmic heating. Biosensors that sense PCR may need the elevated temperature for the PCR to occur. Similarly, gas sensors may need a higher temperature environment.

First dielectric layer 140 may comprise a high-k dielectric deposited, for example, using Atomic Layer Deposition (ALD). The expression "high-k" refers to a high dielectric constant. In the field of semiconductor device structures and manufacturing processes, high-k may refer to a dielectric constant that is greater than the dielectric constant of $SiO_2$ (i.e., greater than 3.9). In some embodiments, this dielectric layer may have a thickness between about 20 Å and about 40 Å (i.e., 2 nm to 4 nm). It may be a high-K dielectric material, such as hafnium silicate, hafnium oxide, zirconium oxide, aluminum oxide, tantalum pentoxide, hafnium dioxide-alumina ($HfO_2$—$Al_2O_3$) alloy, or any combinations thereof. Second dielectric layer 145 may comprise $SiO_2$.

The silicon nanowires comprising the nanowire heaters and the nanowire sensors may have a thickness equivalent to the thickness of the active doped/diffusion regions, which may be approximately 100 nm to 150 nm (i.e., 1000-1500 Å). The silicon nanowire width may be approximately between 50 nm to 500 nm. The depth of a sensing well (e.g., a "sensing well" 150 or a "sensing well" 155) may be approximately 1 um (e.g., the thickness of "buried oxide" BOX) plus approximately 150 nm (e.g., thickness of the active doped/diffusion regions), but this can be approximated as 1 um.

Figure 2:
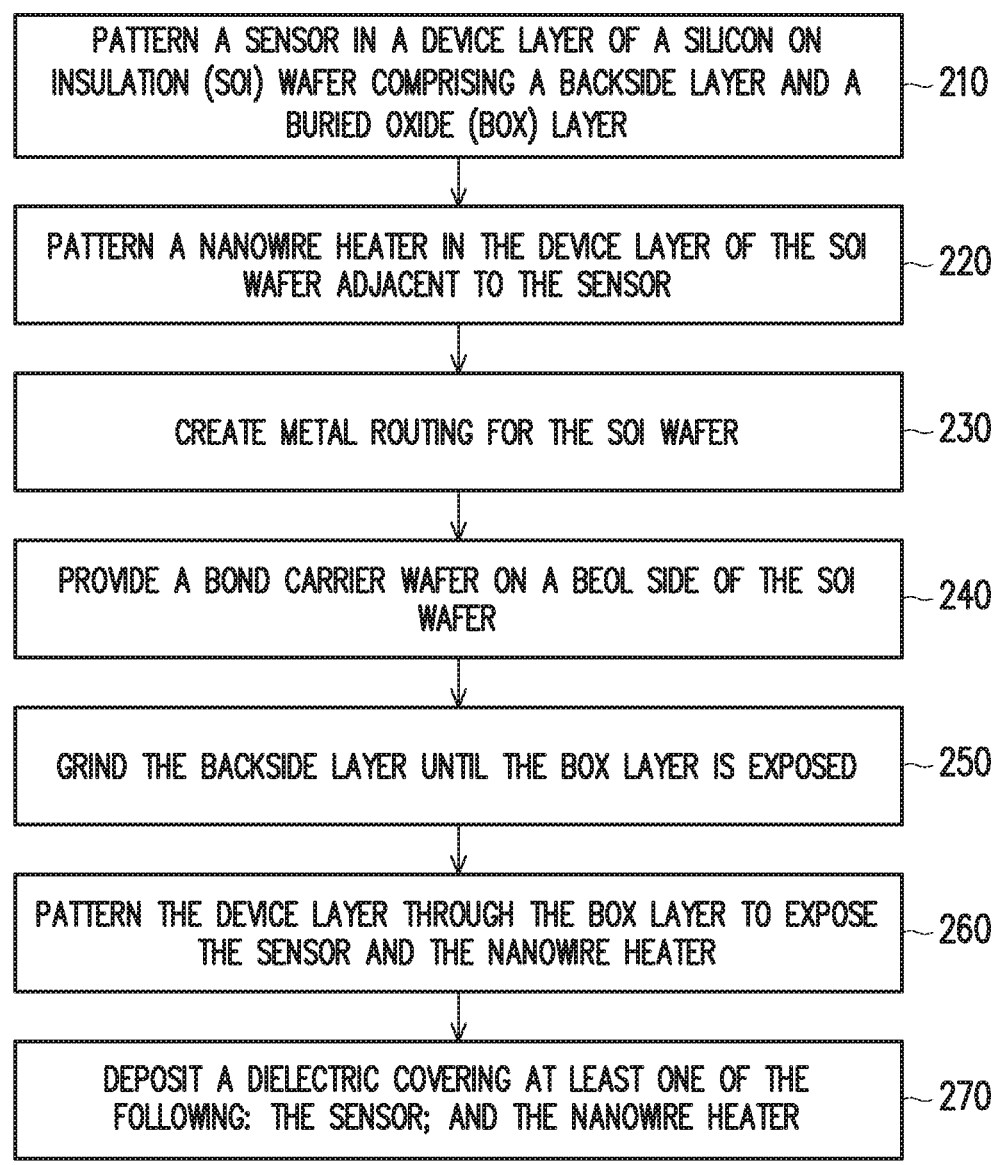
FIG. 2 is a flow chart of a method for providing a sensor with a nanowire heater in accordance with some embodiments.

FIG. 2 is a flow chart setting forth the general stages involved in a method 200 consistent with an embodiment of the disclosure for providing a sensor with a nanowire heater. Ways to implement the stages of method 200 shown in FIG. 2 will be described in greater detail below in conjunction with FIGS. 3-7.

Figure 3:
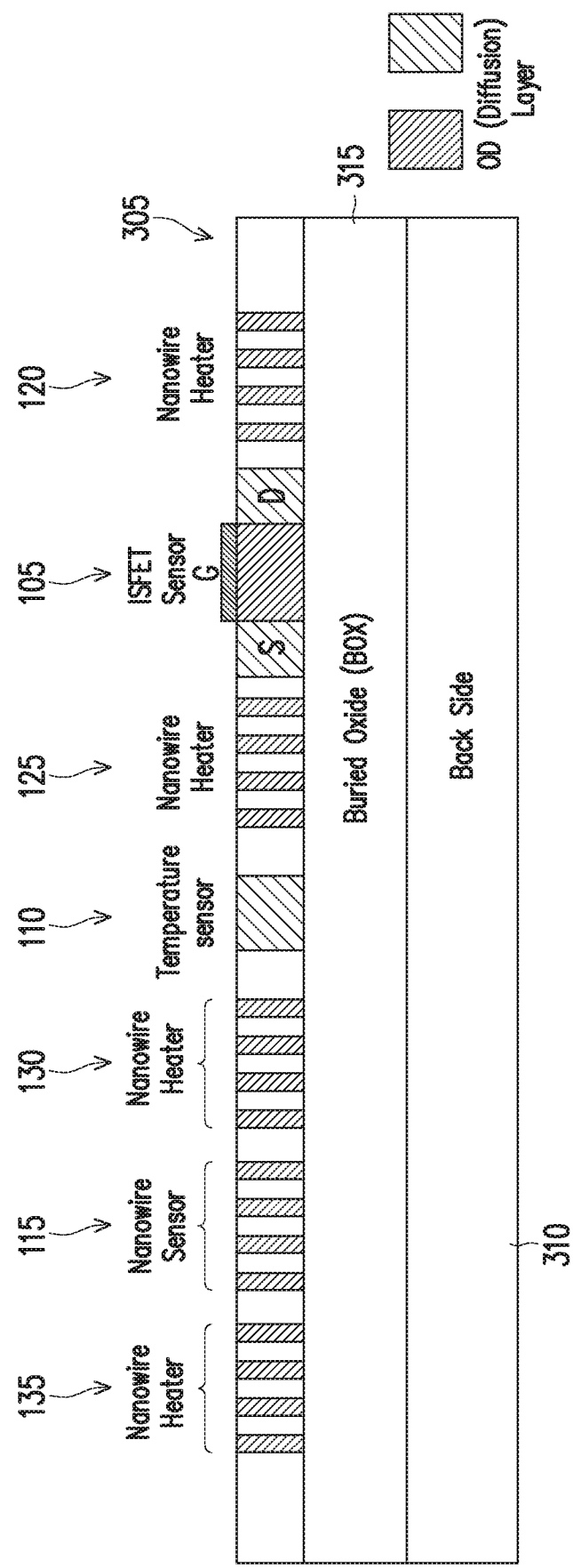
FIG. 3 illustrates patterning a sensor and a nanowire heater in accordance with some embodiments.

Method 200 may proceed to stage 210 where a sensor may be patterned in a device layer 305 of a Silicon on Insulation (SOI) wafer comprising a backside layer 310 and a Buried Oxide (BOX) layer 315 as shown in FIG. 3. Device layer 305 may comprise, but is not limited to, a Front End of Line (FEOL) layer. From stage 210, where the sensor is patterned in device layer 305 of the SOI wafer, method 200 may advance to stage 220 where a nanowire heater may be patterned in device layer 305 of the SOI wafer adjacent to the sensor as shown in FIG. 3. For example, nanowire heaters and sensors (e.g., bio-sensing devices, gas sensing devices, temperature sensing devices, etc.) may be patterned at device 305 of the SOI wafer. Consistent with embodiments of the disclosure, nanowire heaters and sensors may be concurrently patterned/fabricated in device layer 305. For example, stage 210 may be performed at the same time as stage 220. Nanowires and bio-sensing/gas sensing devices may be doped separately. For example, a sensor implemented as a ISFET may have different doping requirements compared to a nanowire heater. Nanowire sensors may have lower doping densities than nanowire heaters. The doping range for a nanowire heater may be approximately $1\times10^{18}$ $cm^{-3}$ or above, while the doping range for a nanowire sensor may be approximately $1\times10^{16}$ $cm^{-3}$ to $1\times10^{18}$ $cm^{-3}$. A nanowire sensor may be doped differently from a nanowire heater. First nanowire heater 120 and second nanowire heater 125 may be adjacent to first sensor 105, second nanowire heater 125 and third nanowire heater 130 may be adjacent to second sensor 110, and third nanowire heater 130 and fourth nanowire heater 135 may be adjacent to third sensor 115 as shown in FIG. 1 for example.

Figure 4:
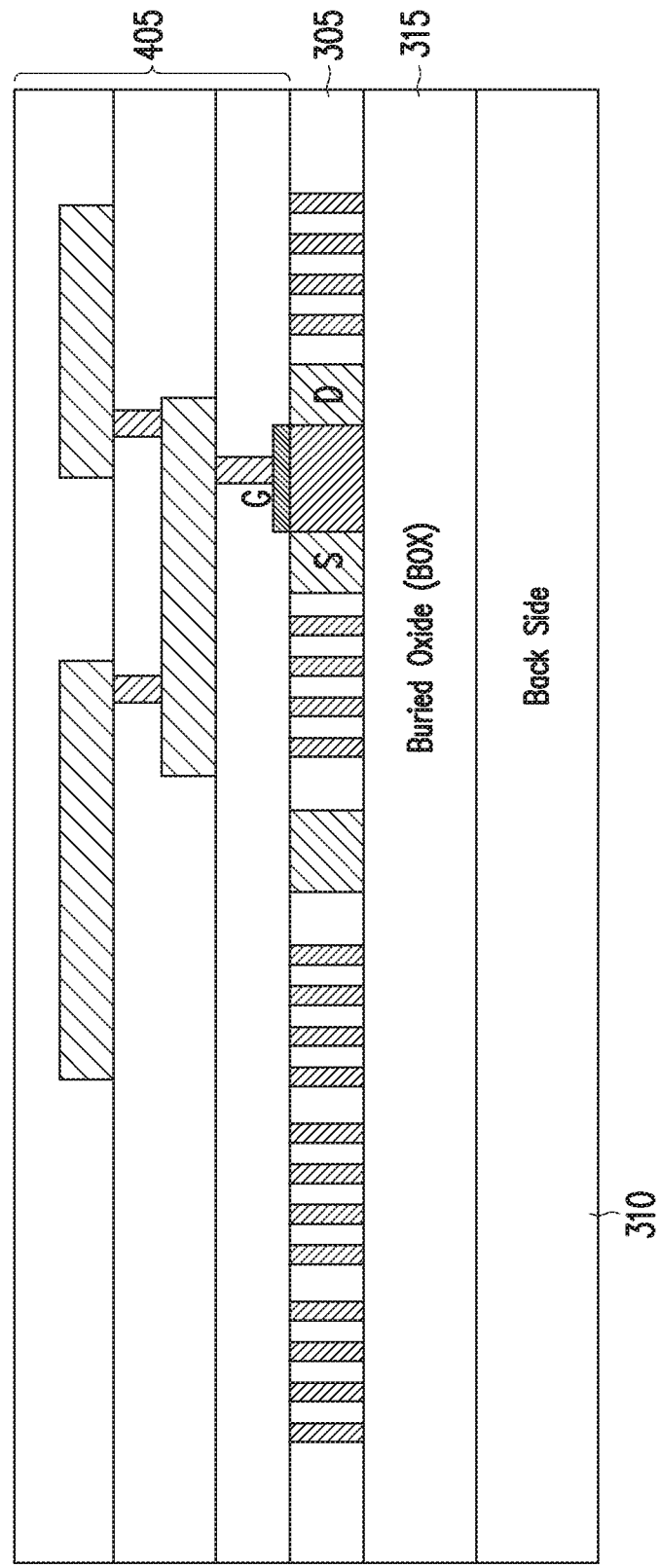
FIG. 4 illustrates creating metal routing in accordance with some embodiments.

Once the nanowire heater is patterned in device layer 305 of the SOI wafer adjacent to the sensor in stage 220, method 200 may continue to stage 230 where metal routing 405 may be created for the SOI wafer as shown in FIG. 4. For example, individual devices (e.g., transistors, capacitors, resistors, etc.) may be interconnected by wiring on the SOI wafer, for example, with the metallization layer via metal routing 405. Metal routing 405 may comprise, but is not limited to, Back End of Line (BEOL) metal routing.

Figure 5:
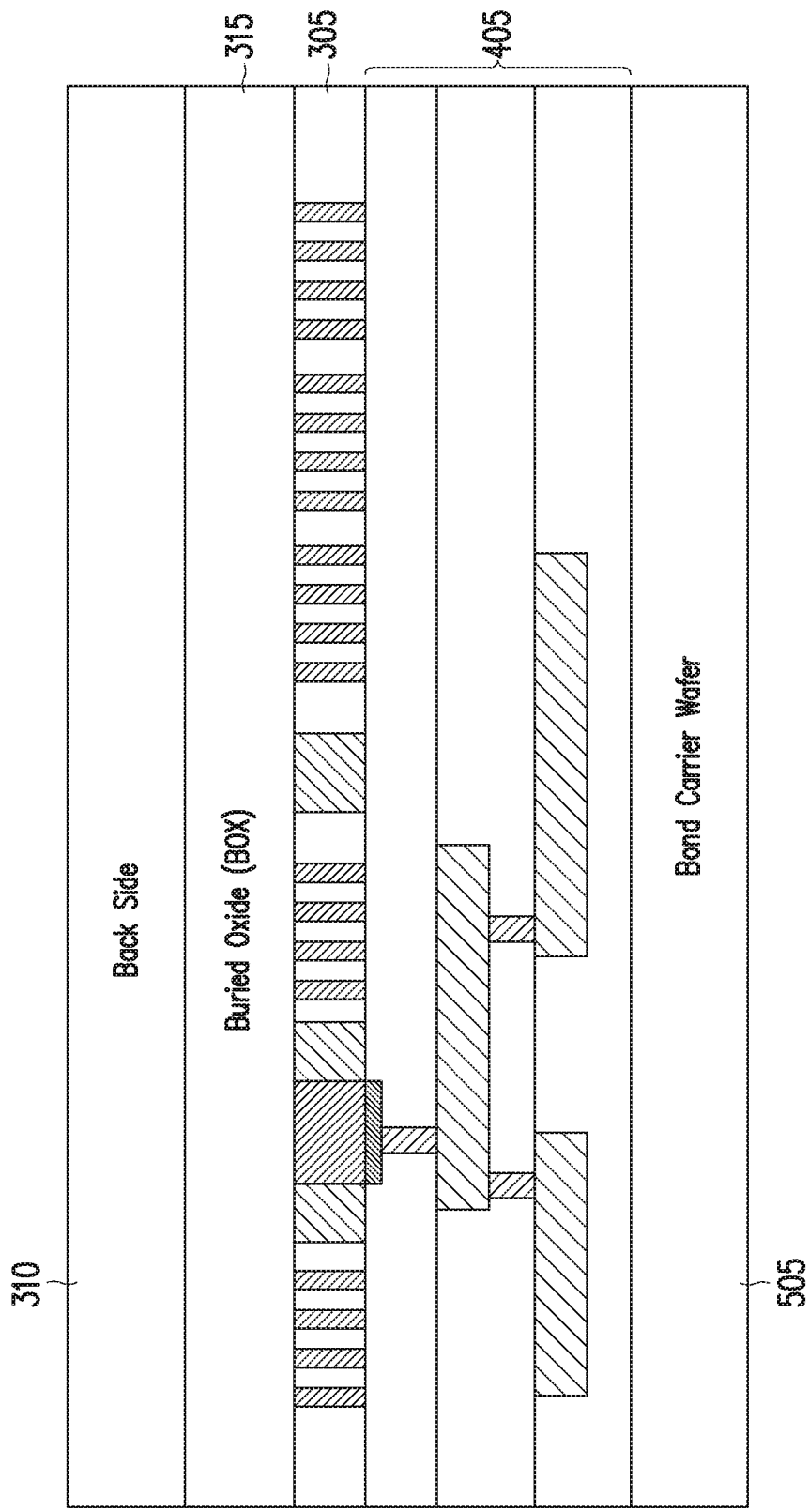
FIG. 5 illustrates providing a bond carrier wafer in accordance with some embodiments.

After metal routing 405 is created for the SOI wafer in stage 230, method 200 may proceed to stage 240 where a bond carrier wafer 505 may be provided on a metal routing side of the SOI wafer. For example, the SOI wafer may be flipped and the bond carrier wafer 505 may be added as illustrated in FIG. 5.

Figure 6:
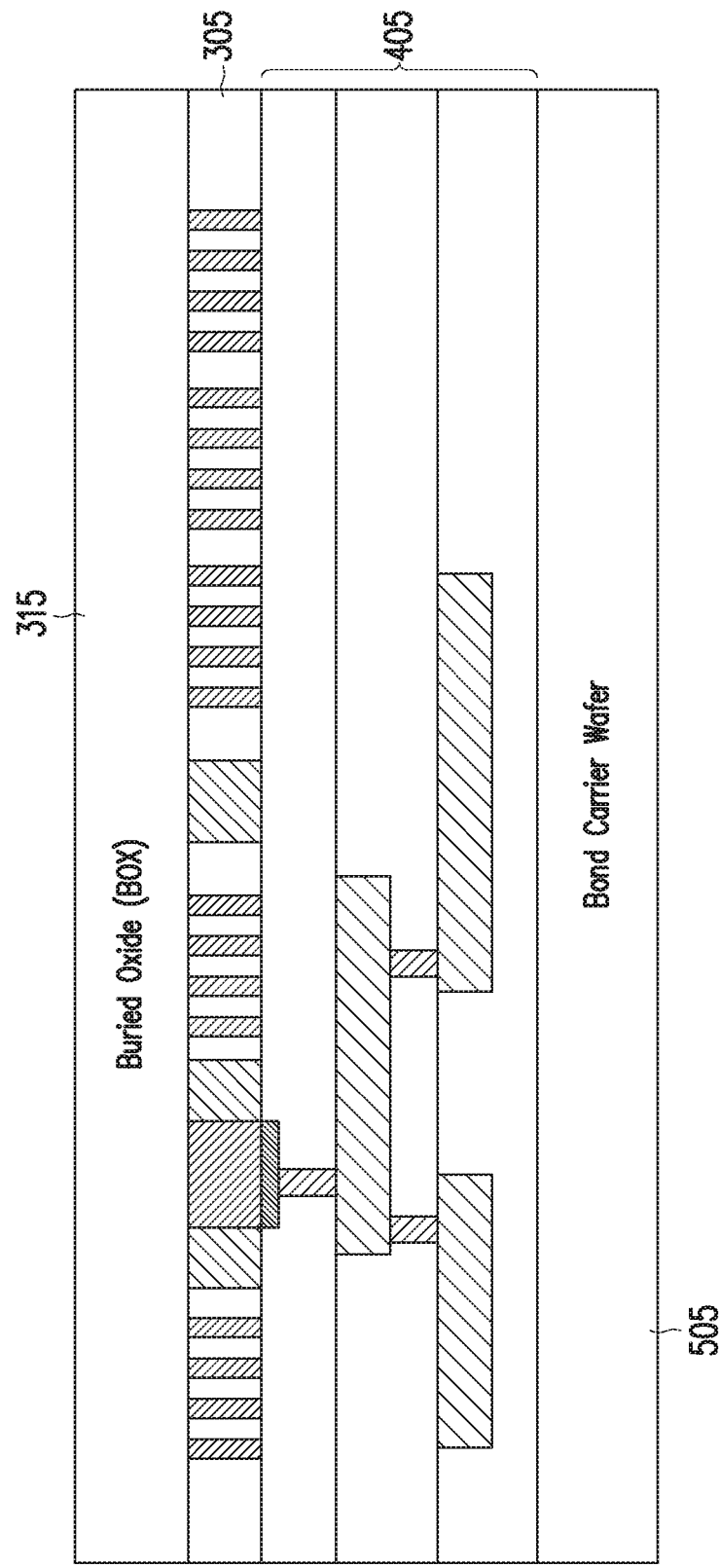
FIG. 6 illustrates grinding the backside layer until a Buried Oxide (BOX) layer is exposed in accordance with some embodiments.

From stage 240, where bond carrier wafer 505 is provided on the metal routing side of the SOI wafer, method 200 may advance to stage 250 where backside layer 310 may be ground until BOX layer 315 is exposed. For example, the SOI wafer with backside layer 310 ground off is illustrated in FIG. 6. Backside layer 310 may be ground off using, for example, a wafer grinder (i.e., rough grinding), followed by Chemical Mechanical Planarization (CMP) (i.e., fine polishing).

Figure 7:
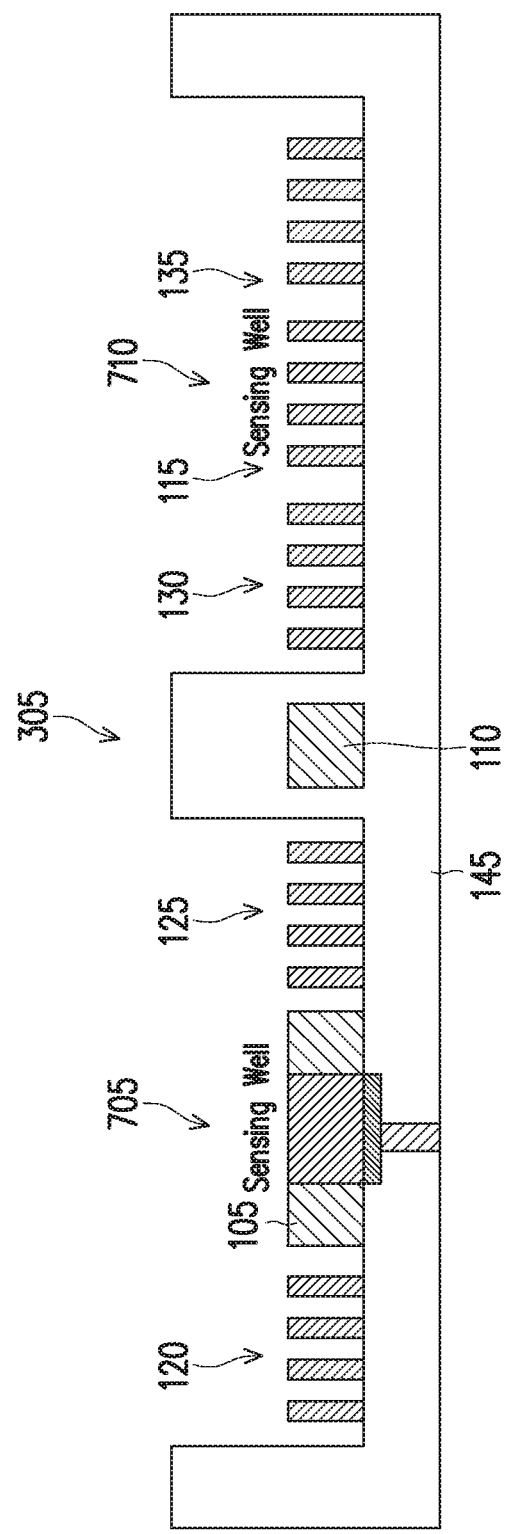
FIG. 7 illustrates patterning a device layer through the BOX layer to expose the sensor and the nanowire heater in accordance with some embodiments.

Once backside layer 310 is ground until BOX layer 315 is exposed in stage 250, method 200 may continue to stage 260 where device layer 305 may be patterned through BOX layer 315 to expose the sensor and the nanowire heater. For example, as illustrated in FIG. 7, first sensor 105, third sensor 115, first nanowire heater 120, second nanowire heater 125, third nanowire heater 130, and fourth nanowire heater 135 may be exposed. Oxide (e.g., from second dielectric layer 145) maybe left around second sensor 110 (e.g., a temperature sensor). In other words, the oxide may be patterned to expose nanowires and biosensors, creating sensing wells (e.g., a first sensing well 705 and a second sensing well 710). If dry etching is used, antenna diodes may be needed, for example, to prevent damage of supporting transistor circuitry.

After device layer 305 is patterned through BOX layer 315 to expose the sensor and the nanowire heater in stage 260, method 200 may proceed to stage 270 where first dielectric layer 140 may be deposited covering at least one of the sensor and the nanowire heater as illustrated in FIG. 1. For example, an Atomic Layer Deposition (ALD) high-k (where k is a dielectric constant) dielectric may be deposited covering the nanowires and biosensors. Once first dielectric layer 140 is deposited covering at least one of the sensor and the nanowire heater in stage 270, method 200 may then end.

Figure 8:
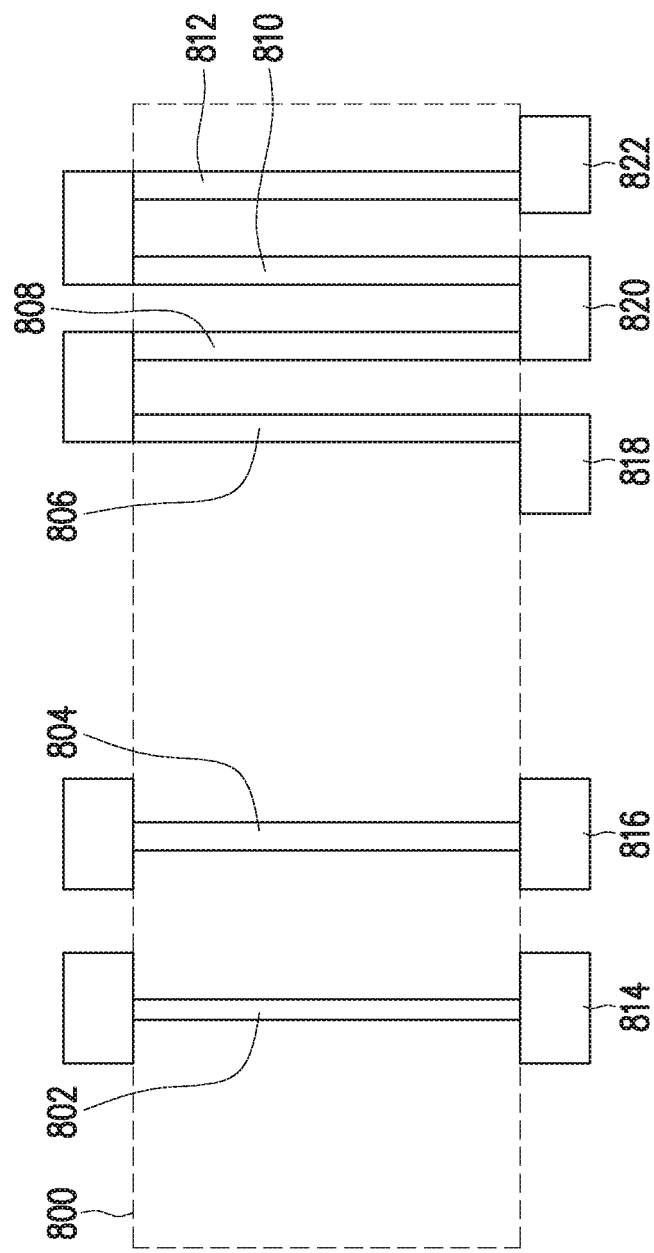
FIG. 8 illustrates nanowire connections in accordance with some embodiments.

FIG. 8 illustrates a top view of a sensing well showing connections between segments of nanowires. As shown in FIG. 8, nanowires, either nanowire heaters or nanowire sensors, may comprise segments disposed in sensing well 800. The segments may comprise individual segments 802 and 804 or may comprise segments 806, 808, 810, and 812 that may be linked together. The segments may have contact connections 814, 816, 818, 820, and 822 to backend routing, for example, to the metal routing to reduce the resistance of a node.

Figure 9:
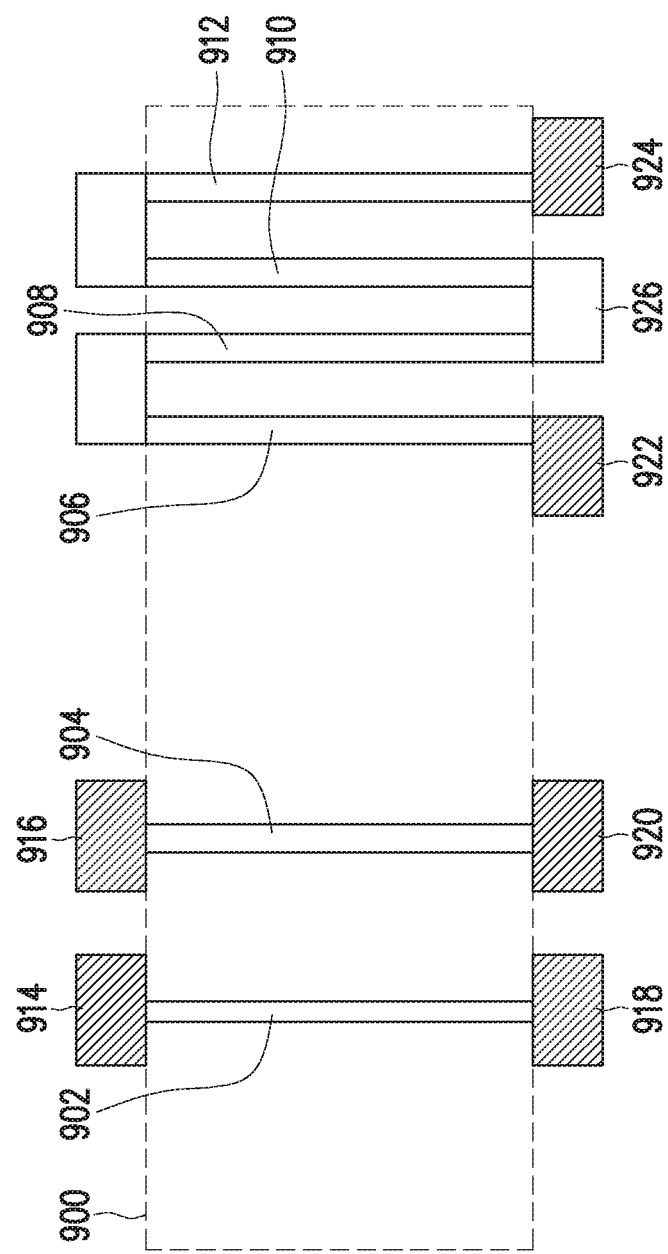
FIG. 9 illustrates nanowire connections in accordance with some embodiments.

FIG. 9 illustrates a top view of a sensing well 900 showing connections between segments of nanowires. As shown in FIG. 9, nanowires, either nanowire heaters or nanowire sensors, may comprise segments. The segments may comprise individual segments 902 and 904 or may comprise segments 906, 908, 910, and 912 that may be linked together. Nanowire contacts 914, 916, 918, 920, 922, and 924 to the metal routing may comprise Si that may be doped differently from the rest of nanowire. As shown in FIG. 9, segments that may be linked together may have an internal node 926 (e.g., with connections to backend metal to reduce resistance).

Figure 10C:
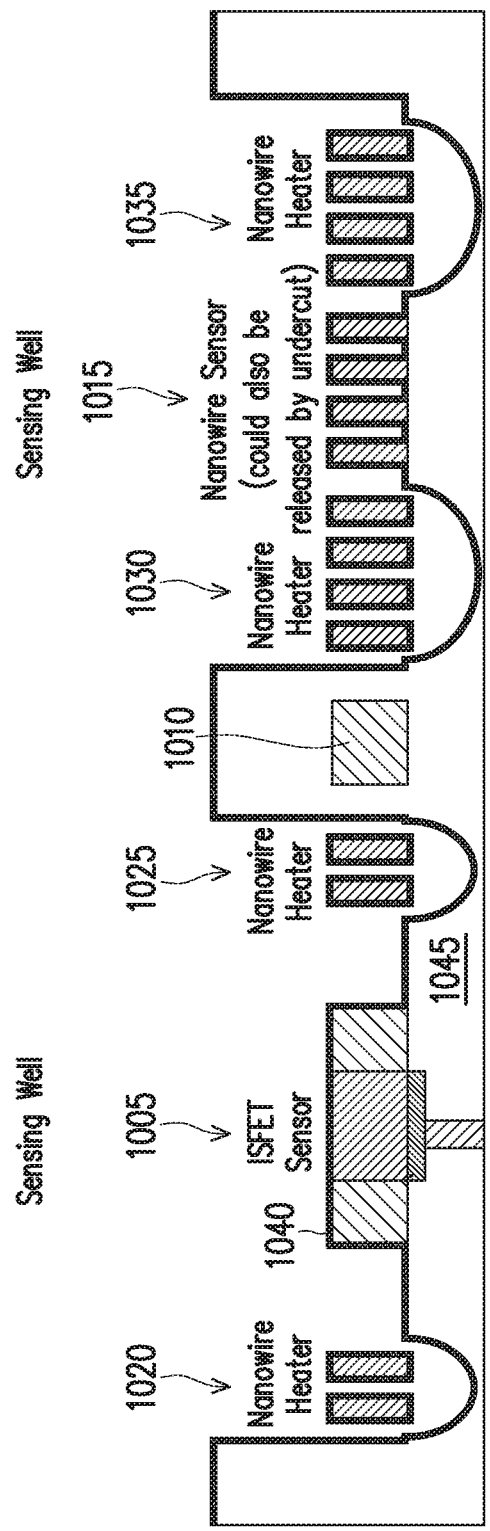

FIG. 10A, FIG. 10B, and FIG. 10C illustrate oxide overetch. As shown in FIG. 10A, FIG. 10B, and FIG. 10C, a first nanowire heater 1020 and a second nanowire heater 1025 may be adjacent to a first sensor 1005, second nanowire heater 1025 and a third nanowire heater 1030 may be adjacent to a second sensor 1010, and third nanowire heater 1030 and a fourth nanowire heater 1035 may be adjacent to a third sensor 1015. As shown in FIG. 10C, a first dielectric layer 1040 may be formed over first sensor 1005, second sensor 1010, third sensor 1015, first nanowire heater 1020, second nanowire heater 1025, third nanowire heater 1030, and fourth nanowire heater 1035 as will be described in greater detail below. Second sensor 1010 may comprise a temperature sensor and may be covered by a second dielectric layer 1045 that may be covered by first dielectric layer 1040.

FIG. 10A may be similar to FIG. 7 (stage 260) where device layer 305 may be patterned through BOX layer 315 to expose the sensor and the nanowire heater. However, in addition to exposing the sensor and the nanowire heater, oxide overetch with sufficient undercut may be used to let heater nanowires to be released (i.e., removing the material underneath the device, which may comprise oxide) as shown in FIG. 10B. Oxide overetch may refer to the continuation of the removal of oxide. Dry etching may be used with sufficient isotropicity to allow the oxide material underneath the nanowires to be removed. ISFET-based sensors (e.g., first sensor 1005) may be covered with PR to prevent release. Nanowire sensors may be released or not released (e.g., again using PR). As shown in FIG. 10C, first dielectric layer 1040 (e.g., ALD high-k dielectric) may be deposited (similar to stage 270), which may be needed for bio-sensing applications involving liquid environments for example.

Figure 11A:
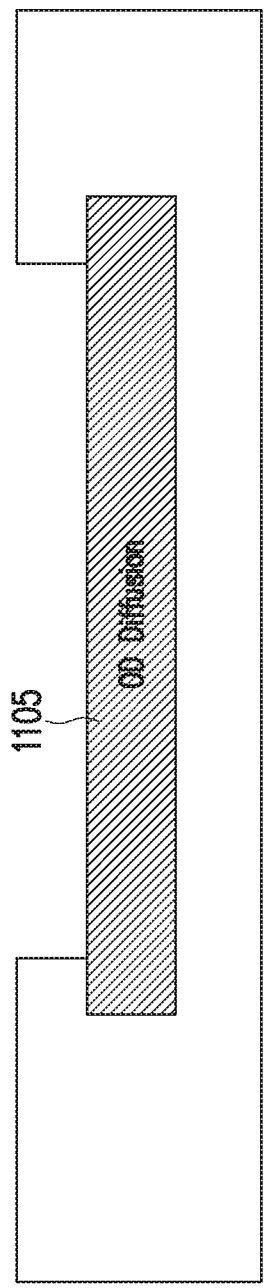
FIGS. 11A and 11B illustrate keeping the Oxide Diffusion (OD) until the end of the process and then etching the OD into nanowires in accordance with some embodiments.
Figure 11B:
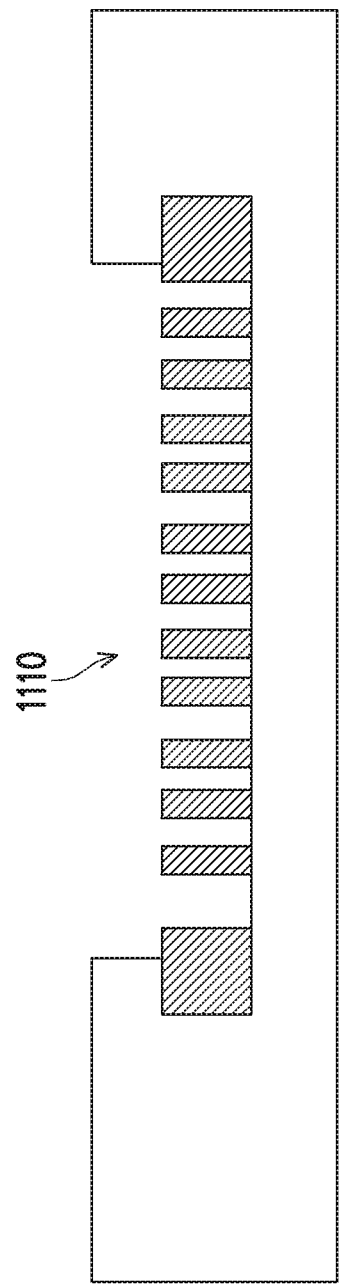

FIG. 11A and FIG. 11B illustrate an embodiment of the disclosure in which an OD diffusion 1105 is kept until the end. Then OD diffusion 1105 of FIG. 11A may be etched into nanowires 1110 as shown in FIG. 11B. In this embodiment, the BOX height may be, for example, 3 k Angstroms (i.e., or 300 nm) or below because a thin photoresist to achieve good nanowire resolution may be used.

FIG. 12A and FIG. 12B illustrate an embodiment of the disclosure in which a bio-sensor application may require an elevated temperature to perform an analysis. As shown in FIG. 12A and FIG. 12B, a first nanowire heater 1210 and a second nanowire heater 1215 may be adjacent to a sensor 1205 having receptors 1220. A first dielectric layer may be formed over sensor 1205, first nanowire heater 1210, and second nanowire heater 1215. For example, extension/elongation in a PCR may need a temperature ~70 C-80 C. As shown in FIG. 12A, a surface chemistry treatment may be provided to sensor 1205 introduced, for example, by gas phase process. Consistent with embodiments of the disclosure, the gas phase process may comprise vapor phase deposition. For example, a solution containing the surface chemistry such as APTES [(3-Aminopropyl) triethoxysilane] or APTMS [(3-Aminopropyl) triethoxysilane] may be vaporized in a vacuum environment into a gaseous phase. The vaporized material may travel to the sensor and attaches to it for example.

With biosensor applications, charge from a biological sample may affect a nanowire sensor's conductivity as illustrated by FIG. 12B. If the biological sample contains negative charge, this may induce positive charge on the surface of the nanowire's conductive material. If the biological sample contains positive charge, this may induce negative charge on the nanowire's conductive material. The biological sample and the nanowire's conductive material may be separated by a dielectric, so there may be a capacitive effect. If the nanowire's conductive material is p-type and positive charge gets induced on its surface, this positive charge may increase the conductivity of the p-type nanowire (analogous to a PMOS accumulation mode). If negative charge gets induced on its surface, this negative charge may decrease the conductivity of the p-type material. If the nanowire's conductive material is n-type and negative charge gets induced on its surface, this negative charge may increase the conductivity of the n-type nanowire (analogous to a NMOS accumulation mode). If positive charge gets induced on its surface, this positive charge may decrease the conductivity of the n-type material.

Figure 13A:
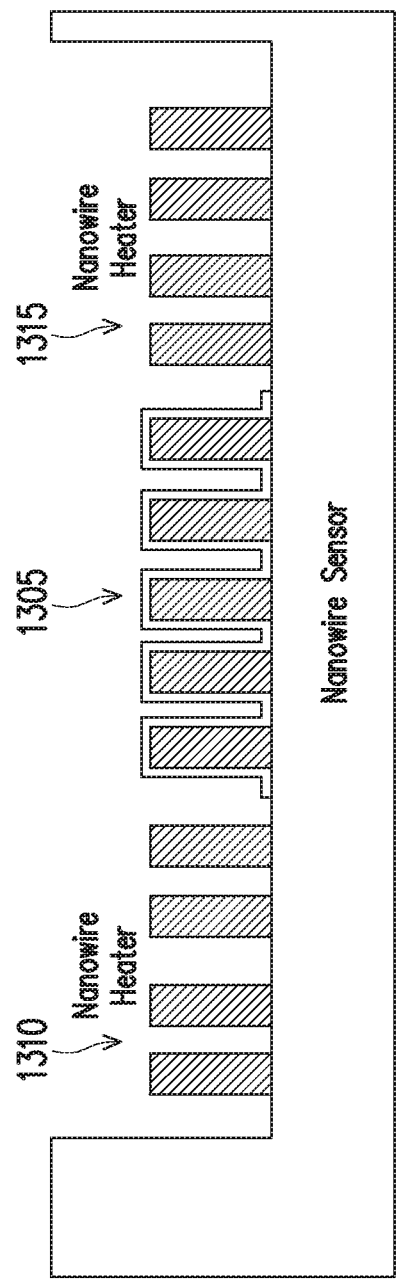
FIGS. 13A, 13B, 13C, and 13D illustrate that there may be no need to put a high-k material over sensing wells for gas sensors in accordance with some embodiments.
Figure 13B:
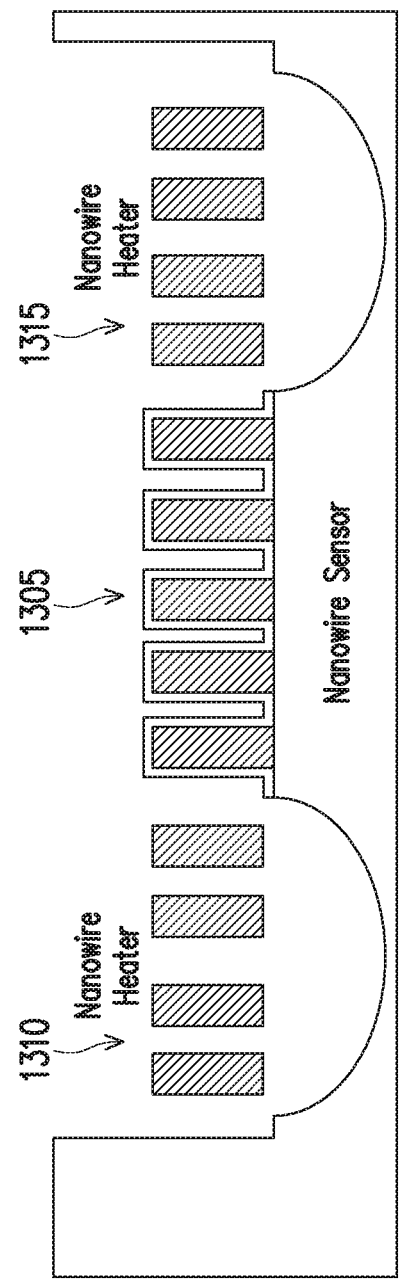
Figure 13C:
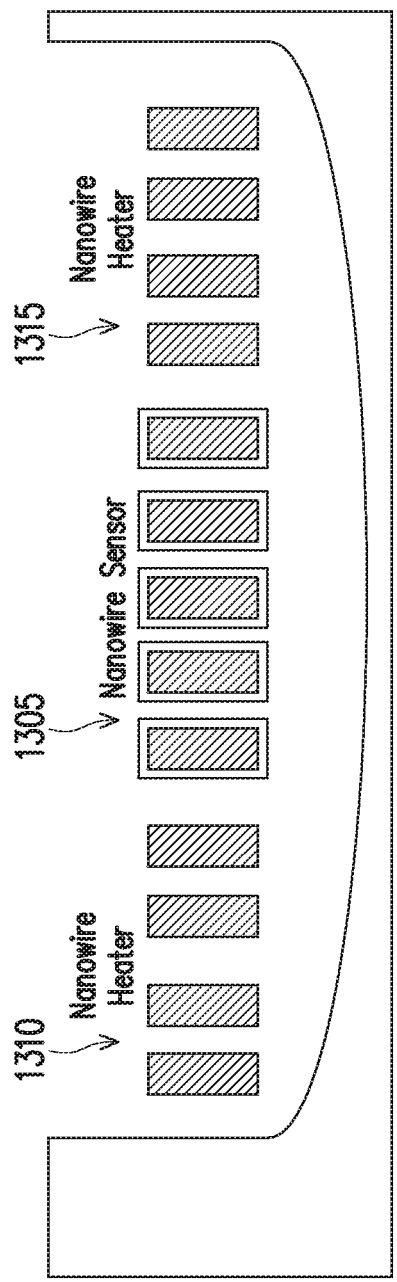
Figure 13D:
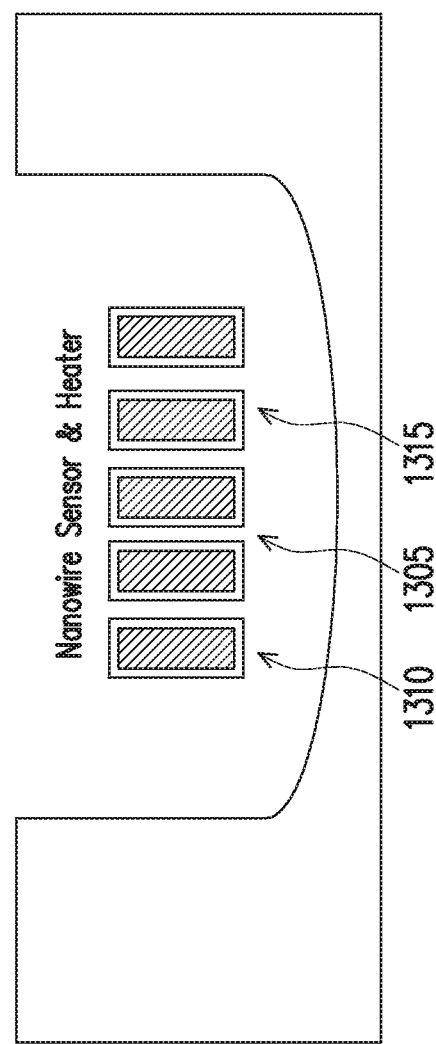

FIG. 13A, FIG. 13B, FIG. 13C, and FIG. 13D illustrate sensing wells for gas sensors. As shown in FIG. 13A, FIG. 13B, FIG. 13C, and FIG. 13D, a first nanowire heater 1310 and a second nanowire heater 1315 may be adjacent to a sensor 1305. In the case of nanowire sensors (e.g., sensor 1305), there may be no need to put a high-k material over sensing well for the gas sensor case because the sensor may not be in a wet fluidic environment. For example, nanowire sensors (e.g., sensor 1305) may be bare-Si or have an appropriate surface coating. The surface coating may comprise, but is not limited to, another semiconducting material such as $SnO_2$. Gas sensors may have different temperature requirements depending on the surface coating. $SnO_2$ may have a 150 C-400 C operating temperature requirement for example. FIG. 13A illustrates an embodiment where no nanowire is released. FIG. 13B illustrates an embodiment where only the nanowire heaters (e.g., first nanowire heater 1310 and second nanowire heater 1315) are released. FIG. 13C illustrates an embodiment where both the nanowire sensors (e.g., sensor 1305) and the nanowire heaters (e.g., first nanowire heater 1310 and second nanowire heater 1315) are released. Releasing nanowire heater and/or nanowire sensors may create more surface area for heating and sensing. FIG. 13D illustrates an embodiment where the nanowire sensors and the nanowire heaters are the same. In other words, FIG. 13D illustrates an embodiment where the nanowire serves the dual role of both sensing biological/gaseous materials and heating up the environment.

Figure 14A:
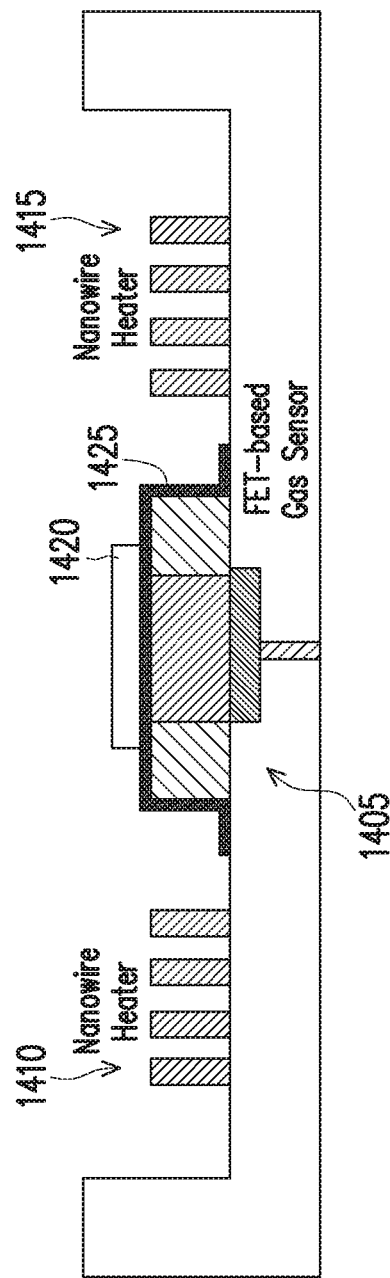
FIGS. 14A and 14B illustrate using a sensing material in conjunction with a Field Effect Transistor in accordance with some embodiments.
Figure 14B:
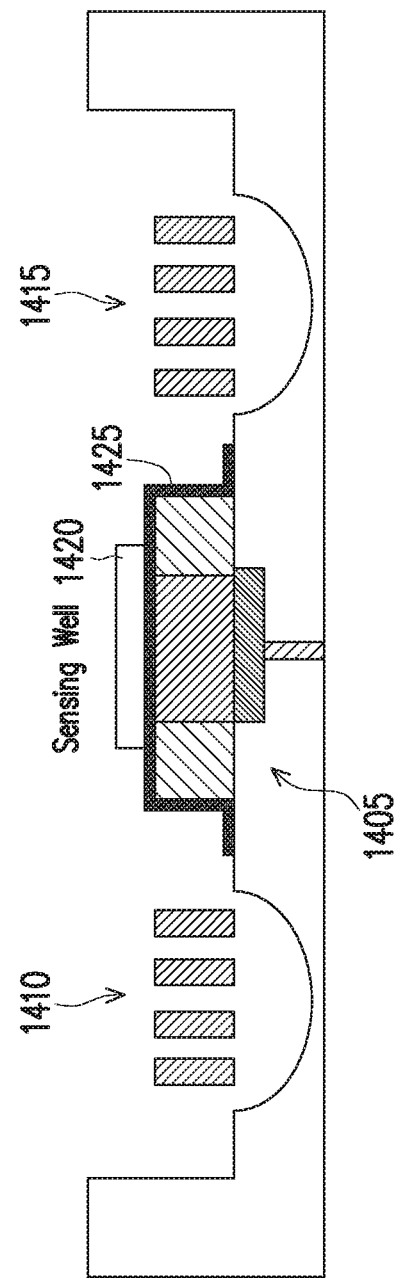

FIG. 14A and FIG. 14B illustrate an embodiment of the disclosure in which a sensing material is used in conjunction with a Field Effect Transistor. As shown in FIG. 14A and FIG. 14B, a first nanowire heater 1410 and a second nanowire heater 1415 may be adjacent to a sensor 1405. In the case of a FET-based gas sensor that uses a special gate electrode 1420 as a sensing material, a high-k dielectric 1425 may need to be patterned on sensor 1405. Additionally, special gate electrode 1420 may have to be routed to a pad outside of the sensing well. Special gate electrode 1420 (e.g., a gas sensing layer) may comprise, for example, palladium or metal oxides such as $SnO_2$, $ZnO$, $TiO_2$, $WO_3$, $In_2O_3$, or $Fe_2O_3$. Special gate electrode 1420 comprising a gas sensing layer may absorb oxygen from the atmosphere. The absorbed oxygen snatches away surface electrons of the gas sensing layer, reducing the gas sensing layer's conductivity. When the air is contaminated by reducing gases (e.g., CO, $CO_2$, $H_2$, $NH_3$, $CH_4$, ethanol, $H_2S$, and $NO_2$), the reducing gases donate electrons to the surface of the gas sensing layer, increasing the gas sensing layer's conductivity. The modulation of available surface charge in special gate electrode 1420 (e.g., gas sensing layer) may correspondently modulate the amount of charge in the channel region of the MOSFET device.

FIG. 14A illustrates an embodiment where no nanowire heater (e.g., first nanowire heater 1410 and second nanowire heater 1415) is released. FIG. 14B illustrates an embodiment where the nanowire heater (e.g., first nanowire heater 1410 and second nanowire heater 1415) is released. Releasing nanowire heaters may create more surface area for heat to be dissipated since the bottom part of the nanowire heater is not blocked by oxide. Because oxide is not a good thermal conductor, this may allow better efficiency of maintaining the temperature environment for the sensor. However, not releasing the nanowire heater may be adequate for the purpose of the device.

Figure 15:
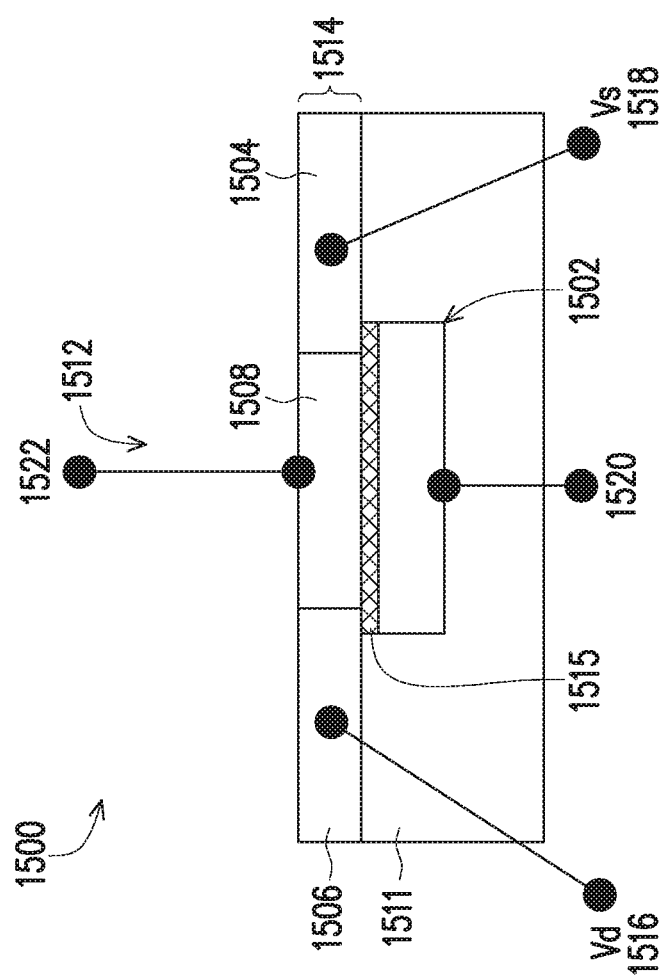
FIG. 15 illustrates an Ion-Sensitive Field-Effect Transistor (ISFET) in accordance with some embodiments.

FIG. 15 illustrates an Ion-Sensitive Field-Effect Transistor (ISFET) 1500. First sensor 105, first sensor 1005, and sensor 1405 may comprise ISFET 1500 for example. ISFET 1500 may include electrical contacts 1516 and 1518 to drain region 1506 and source region 1504, respectively. A frontside gate contact 1520 may be made to gate 1502 in substrate 1511, while a back-side gate contact 1522 may be made to channel region 1508. It should be noted that back-side gate contact 1522 may not need to physically contact substrate 1514 or any interface layer over substrate 1514. Thus, while an FET may use a gate contact to control conductance of the semiconductor between the source and drain (e.g., the channel), dual gate back-side sensing ISFET 1500 may allow receptors formed on a side opposing gate 1502 of the FET device to control the conductance, while gate 1502 may provide another region to control the conductance. Therefore, ISFET 1500 may be used to detect one or more specific biomolecules or bio-entities in the environment around and/or in opening 1512.

Gate 1502 may be separated from the channel region 1508 by a gate dielectric 1515. In some embodiments, gate 1502 may be doped polysilicon or other suitable conductive material. In some embodiments, gate dielectric 1515 may comprise silicon oxide. Other example gate dielectrics may include, but are not limited to, silicon nitride, silicon oxynitride, a dielectric with a high dielectric constant (high-k), or combinations thereof. Examples of high-k materials may include hafnium silicate, hafnium oxide, zirconium oxide, aluminum oxide, tantalum pentoxide, hafnium dioxide-alumina ($HfO_2$—$Al_2O_3$) alloy, or combinations thereof.

Embodiments of the disclosure may comprise nanowire heaters integrated adjacent to sensors fabricated using a back side sensing CMOS platform. This may be useful for small sample applications such as single-molecular PCR (i.e., biosensors) or for high-temperature gas sensors. Other systems may use OD (Diffusion) resistor heaters or TiAlN metal heaters located respectively at the frontend and backend of the back side sensing CMOS platform. TiAlN can only provide indirect heating by virtue of being buried in the backend. OD (Diffusion) heaters provide less surface area for heating compared to nanowire heaters. Even though Si nanowire heaters are much narrower than OD (diffusion) heaters, nanowires implemented as crystalline silicon do not suffer from electromigration. Rather Si nanowire heaters may provide direct heating as compared to TiAlN buried in backend oxide. Additionally, Si nanowire heaters have more surface area to dissipate heat. Consistent with embodiments of the disclosure, nanowires as heaters in sensing applications may be fabricated in a CMOS compatible process or integrated with a CMOS platform.

An embodiment of the disclosure may comprise a method for providing a sensor with a nanowire heater. Embodiments of the disclosure may comprise patterning a sensor in a device) layer of a Silicon on Insulation (SOI) wafer comprising a backside layer and a Buried Oxide (BOX) layer and patterning a nanowire heater in the device layer of the SOI wafer adjacent to the sensor. Embodiments of the disclosure may further comprise creating metal routing for the SOI wafer, providing a bond carrier wafer on a metal routing side of the SOI wafer, and grinding the backside layer until the BOX layer is exposed. Embodiments of the disclosure may further comprise patterning the device layer through the BOX layer to expose the sensor and the nanowire heater and depositing a dielectric covering at least one of the following: the sensor; and the nanowire heater.

Another embodiment of the disclosure may comprise a sensor and a nanowire heater laterally adjacent to the sensor.

Yet another embodiment of the disclosure may comprise a sensor disposed on a metal routing layer. In addition, embodiments of the disclosure may comprise a nanowire heater laterally adjacent to the sensor, the nanowire heater comprising a plurality of segments being linked together and being released from the metal routing layer. However, the nanowire contact and internal nodes may not be released from the BEOL metal routing layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    patterning a sensor in a device layer of a Silicon on Insulation (SOI) wafer comprising a backside layer and a Buried Oxide (BOX) layer;
    patterning a nanowire heater in the device layer of the SOI wafer adjacent to the sensor;
    creating metal routing for the SOI wafer;
    providing a bond carrier wafer on a metal routing side of the SOI wafer;
    grinding the backside layer until the BOX layer is exposed;
    patterning the device layer through the BOX layer to expose the sensor and the nanowire heater, wherein patterning the device layer through the BOX layer to expose the sensor and the nanowire heater comprises creating sensing wells; and
    depositing a dielectric covering at least one of the following: the sensor; and the nanowire heater.

2. The method of claim 1, wherein patterning the sensor comprises patterning the sensor comprising a nanowire sensor.

3. The method of claim 2, wherein patterning the sensor comprising the nanowire sensor comprises patterning the nanowire sensor comprising a plurality of segments.

4. The method of claim 2, wherein patterning the sensor comprising the nanowire sensor comprises patterning the nanowire sensor comprising a plurality of segments being linked together.

5. The method of claim 1, wherein patterning the sensor comprises patterning the sensor comprising a temperature sensor.

6. The method of claim 1, wherein patterning the sensor comprises patterning the sensor comprising an Ion-Sensitive Field-Effect Transistor (ISFET).

7. The method of claim 1, wherein patterning the sensor comprises patterning the sensor comprising an Ion-Sensitive Field-Effect Transistor (ISFET) comprising a gas sensing device.

8. The method of claim 1, wherein patterning the sensor comprises patterning the sensor comprising an Ion-Sensitive Field-Effect Transistor (ISFET) comprising a bio-sensing device.

9. The method of claim 1, wherein patterning the nanowire heater comprises patterning the nanowire heater comprising a plurality of segments.

10. The method of claim 1, wherein patterning the nanowire heater comprises patterning the nanowire heater comprising a plurality of segments being linked together.

11. The method of claim 1, wherein patterning the device layer through the BOX layer to expose the sensor and the nanowire heater comprises releasing at least one of the following from the BEOL side of the SOI wafer: the sensor comprising a nanowire sensor; and the nanowire heater.

12. The method of claim 1, wherein no dielectric covering is placed on the sensor when the sensor comprises a nanowire gas sensor.

* * * * *